US012598934B2

(12) United States Patent
Chen et al.

(10) Patent No.: US 12,598,934 B2
(45) Date of Patent: Apr. 7, 2026

(54) METHOD OF MANUFACTURING STRUCTURE HAVING MULTI METAL LAYERS

(71) Applicant: MIKRO MESA TECHNOLOGY CO., LTD., Apia (WS)

(72) Inventors: Li-Yi Chen, Tainan City (TW); Chieh-Ting Chen, Hsinchu City (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 383 days.

(21) Appl. No.: 18/530,213

(22) Filed: Dec. 6, 2023

(65) Prior Publication Data

US 2025/0191931 A1 Jun. 12, 2025

(51) Int. Cl.
H10P 50/00 (2026.01)
H10D 86/40 (2025.01)
H10D 86/60 (2025.01)

(52) U.S. Cl.
CPC ............. H10P 50/71 (2026.01); H10D 86/40 (2025.01); H10D 86/60 (2025.01)

(58) Field of Classification Search
CPC ......... H10D 86/40; H10D 86/60; H10P 50/71
See application file for complete search history.

(56) References Cited

U.S. PATENT DOCUMENTS

2008/0093744 A1* 4/2008 Wang ................... C25D 11/022
257/758
2015/0279976 A1* 10/2015 Shih ....................... H10D 99/00
257/43

* cited by examiner

*Primary Examiner* — Matthew L Reames
(74) *Attorney, Agent, or Firm* — CKC & Partners Co., LLC

(57) ABSTRACT

A method of manufacturing a structure having multi metal layers includes: depositing a top metal layer on a bottom metal layer; forming a patterned photoresist on the top metal layer; etching the top and bottom metal layers through first hollow portions of the patterned photoresist to respectively form a top metal pattern and a bottom metal pattern; forming a second hollow portion in the patterned photoresist to expose a portion of the top metal pattern; etching the top metal pattern through the second hollow portion until a top surface portion of the bottom metal pattern is exposed by the etched top metal pattern, in which an etch selectivity of the top and bottom metal layers in the etching the top metal pattern is greater than 1.0; and anodizing the top surface portion to form an anodized segment of the bottom metal layer.

14 Claims, 15 Drawing Sheets

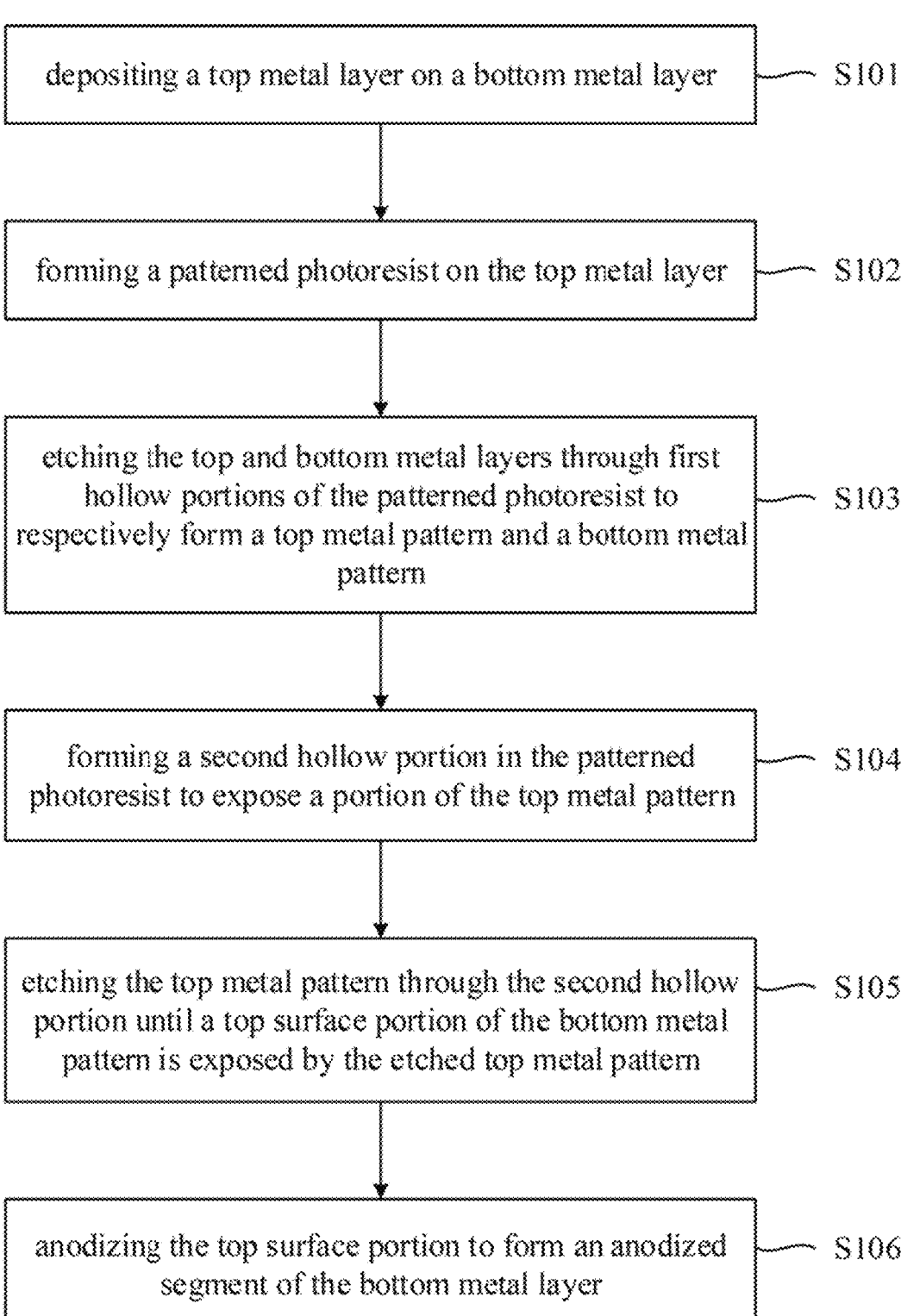

depositing a top metal layer on a bottom metal layer — S101 forming a patterned photoresist on the top metal layer — S102 etching the top and bottom metal layers through first hollow portions of the patterned photoresist to respectively form a top metal pattern and a bottom metal pattern — S103 forming a second hollow portion in the patterned photoresist to expose a portion of the top metal pattern — S104 etching the top metal pattern through the second hollow portion until a top surface portion of the bottom metal pattern is exposed by the etched top metal pattern — S105 anodizing the top surface portion to form an anodized segment of the bottom metal layer — S106

Fig. 1

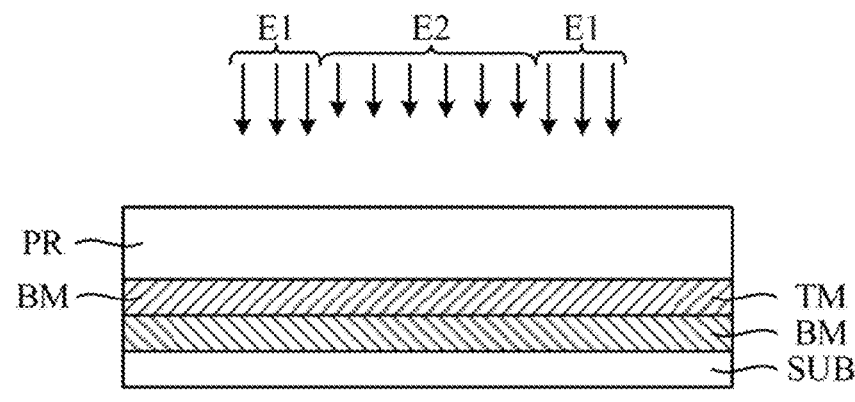
Fig. 3A
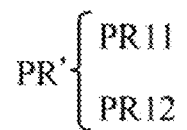
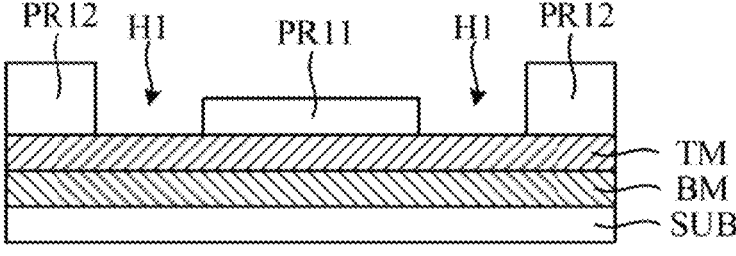
Fig. 3B
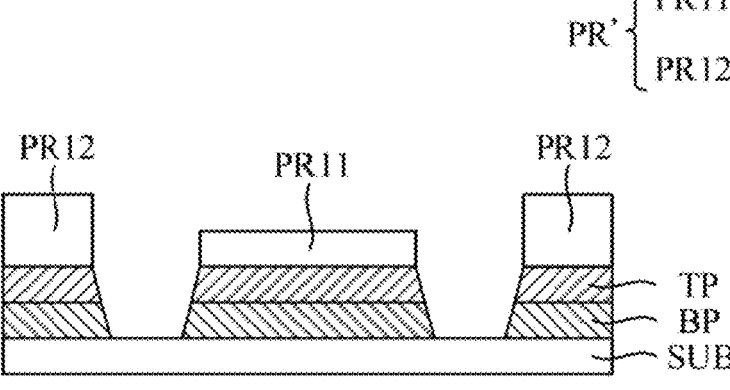
Fig. 3C

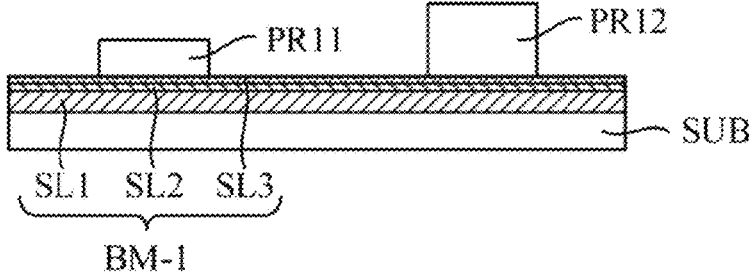
Fig. 9A
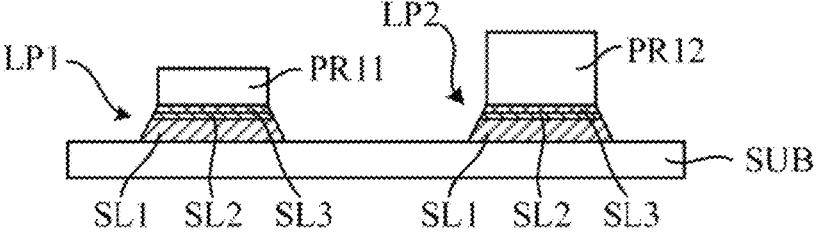
Fig. 9B
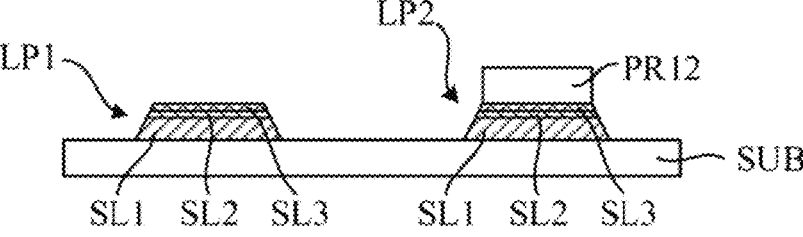
Fig. 9C

METHOD OF MANUFACTURING STRUCTURE HAVING MULTI METAL LAYERS

BACKGROUND

Field of Invention

The present disclosure relates to a method of manufacturing a structure having multi metal layers.

Description of Related Art

The statements in this section merely provide background information related to the present disclosure and do not necessarily constitute prior art.

Traditional display manufacturing is a standardized process set. In recent years, there are more and more new types of displays such as a micro light-emitting diode display, a mini light-emitting diode display, and a quantum dot light-emitting diode display . . . etc., which are promising to dominate the future display market, and thus new display manufacturing processes are waiting to be set up. There are many steps contained in a manufacturing process set in order to produce one display, and reducing one of the steps thereof can reduce the cost and enhance the efficiency.

SUMMARY

According to some embodiments of the present disclosure, a method of manufacturing a structure having multi metal layers includes: depositing a top metal layer on a bottom metal layer; forming a patterned photoresist on the top metal layer; etching the top and bottom metal layers through first hollow portions of the patterned photoresist to respectively form a top metal pattern and a bottom metal pattern; forming a second hollow portion in the patterned photoresist to expose a portion of the top metal pattern; etching the top metal pattern through the second hollow portion until a top surface portion of the bottom metal pattern is exposed by the etched top metal pattern, in which an etch selectivity of the top and bottom metal layers in the etching the top metal pattern is greater than 1.0; and anodizing the top surface portion to form an anodized segment of the bottom metal layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 1 is a flowchart of a method of manufacturing a structure having multi metal layers according to some embodiments of the present disclosure;

FIGS. 3A to 3F are schematic cross-sectional views of intermediate stages of a method of manufacturing a structure having multi metal layers according to some embodiments of the present disclosure;

FIGS. 9A to 9F are schematic cross-sectional views of intermediate stages of a method of manufacturing a structure having multi metal layers according to some embodiments of the present disclosure.

DETAILED DESCRIPTION

Figure 2A:
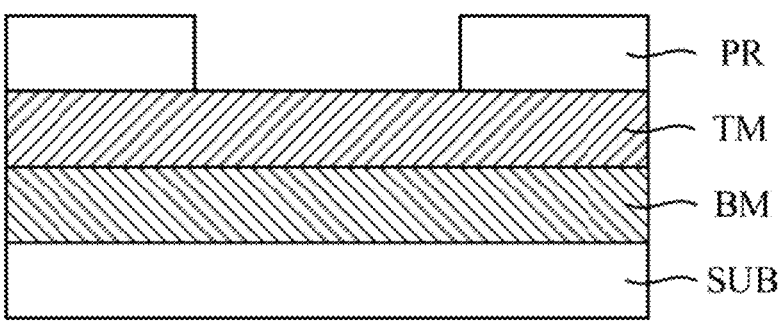
FIGS. 2A to 2C are schematic cross-sectional views of intermediate stages of a method of manufacturing a structure having multi metal layers according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "according to some embodiments" or the like in various places throughout this specification are not necessarily referring to the same embodiment of the disclosure. Furthermore, the particular features, structures, configurations, or characteristics may be combined in any suitable manner in one or more embodiments.

Reference is made to FIG. 1. FIG. 1 is a flowchart of a method of manufacturing a structure having multi metal layers according to some embodiments of the present disclosure. The method begins with step S101 in which a top metal layer is deposited on a bottom metal layer. The method continues with step S102 in which a patterned photoresist is formed on the top metal layer. The method continues with step S103 in which the top and bottom metal layers are etched through first hollow portions of the patterned photoresist to respectively form a top metal pattern and a bottom metal pattern. The method continues with step S104 in which a second hollow portion is formed in the patterned photoresist to expose a portion of the top metal pattern. The method continues with step S105 in which the top metal pattern is etched through the second hollow portion until a top surface portion of the bottom metal pattern is exposed by the etched top metal pattern, in which an etch selectivity of the top and bottom metal layers in the etching the top metal pattern is greater than 1.0. The method continues with step S106 in which the top surface portion is anodized to form an anodized segment of the bottom metal layer. While the method is illustrated and described below as a series of steps or events, it will be appreciated that the illustrated ordering of such steps or events are not to be interpreted in a limiting sense. For example, some steps may occur in different orders and/or concurrently with other steps or events apart from those illustrated and/or described herein. In addition, not all illustrated steps may be required to implement one or more aspects or embodiments of the description herein. Further, one or more of the steps depicted herein may be carried out in one or more separate steps and/or phases.

Reference is made to FIG. 2A. FIG. 2A is a schematic cross-sectional view of an intermediate stage of a method of manufacturing a structure having multi metal layers according to some embodiments of the present disclosure. As shown in FIG. 2A, a bottom metal layer BM is deposited on a substrate SUB, a top metal layer TM is deposited on the bottom metal layer BM, and a patterned photoresist PR is formed on the bottom metal layer BM. In some embodiments, the patterned photoresist PR may be exposed by UV light, but the present disclosure is not limited in this regard.

In some embodiments, the bottom metal layer BM may include at least one element of aluminum, zirconium, hafnium, and tantalum. In some other embodiments, the bottom metal layer BM may include at least one rare earth element.

In some other embodiments, the bottom metal layer BM may include aluminum and silicon. In this way, the bottom metal layer BM can have a better thin film quality (compared to an embodiment of the bottom metal layer BM which includes aluminum only).

In some embodiments, an atomic ratio of aluminum in the bottom metal layer BM is greater than 50%, but the disclosure is not limited in this regard.

In some embodiments, an atomic ratio of copper in the top metal layer TM is greater than 80%, so as to increase the conductivity of a combination of the bottom metal layer BM and the top metal layer TM, but the disclosure is not limited in this regard.

Figure 2B:
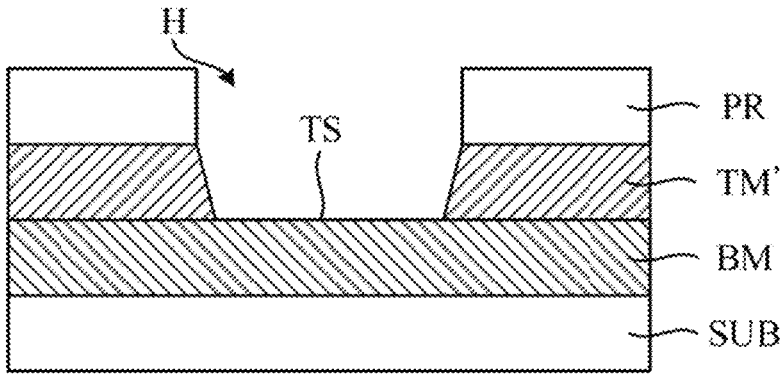

Reference is made to FIG. 2B. FIG. 2B is a schematic cross-sectional view of an intermediate stage of a method of manufacturing a structure having multi metal layers according to some embodiments of the present disclosure. The intermediate stage shown in FIG. 2A may be sequentially followed by the intermediate stage shown in FIG. 2B. As shown in FIG. 2B, the top metal layer TM is etched through the patterned photoresist PR until a top surface portion TS of the bottom metal layer BM is exposed by the etched top metal layer TM', in which an etch selectivity of the top metal layer TM and the bottom metal layer BM in the etching is greater than 1.0. The patterned photoresist PR has a hollow portion H, and the etching exposes the top surface portion TS of bottom metal layer BM in the hollow portion H. In some embodiments, the etch selectivity of the top metal layer TM and the bottom metal layer BM in the etching is greater than 2.0. In this way, the etching depth can be better controlled.

In the embodiment where the bottom metal layer BM contains aluminum and the top metal layer TM contains copper, a wet etching process may be performed to etch the top metal layer TM. In some embodiments, a hydrogen peroxide ($H_2O_2$)-based etchant may be used in the wet etching process.

In the embodiment where the bottom metal layer BM contains aluminum and the top metal layer TM contains molybdenum, a wet etching process may be performed to etch the top metal layer TM. In some embodiments, a hydrogen peroxide-based etchant may be used in the wet etching process. For example, the etchant may contain a mixture of citric acid and hydrogen peroxide ($H_2O_2$).

In some embodiments, a barrier metal layer (not shown) may be formed between the bottom metal layer BM and the top metal layer TM which contains copper. For example, the barrier metal layer may be a molybdenum-containing barrier layer. In general, the etchant for etching the top metal layer TM which contains copper may also be used to etch the barrier metal layer. For example, in the specific embodiment where the bottom metal layer BM, the top metal layer TM, and the barrier metal layer respectively contain aluminum, copper, and molybdenum, the etchant which contains a mixture of sulfuric acid ($H_2SO_4$) and hydrogen peroxide may be used to etch the top metal layer TM and the barrier metal layer without etching (or with slightly etching) the bottom metal layer BM.

Figure 2C:
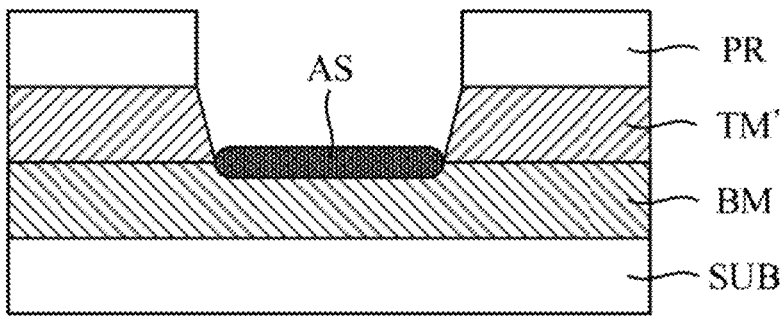

Reference is made to FIG. 2C. FIG. 2C is a schematic cross-sectional view of an intermediate stage of a method of manufacturing a structure having multi metal layers according to some embodiments of the present disclosure. The intermediate stage shown in FIG. 2B may be sequentially followed by the intermediate stage shown in FIG. 2C. As shown in FIG. 2C, the top surface portion TS of the bottom metal layer BM is anodized to form an anodized segment AS (i.e., anodic oxide) of the bottom metal layer BM. In this way, a structure having multi metal layers (i.e., the bottom metal layer BM and the etched top metal layer TM') is manufactured. The anodized segment AS is spaced apart from a side of the bottom metal layer BM away from the etched top metal layer TM'.

In some embodiments, the patterned photoresist PR shown in FIG. 2C may be removed after the anodization of the top surface portion TS of the bottom metal layer BM is finished.

Reference is made to FIG. 3A. FIG. 3A is a schematic cross-sectional view of an intermediate stage of a method of manufacturing a structure having multi metal layers according to some embodiments of the present disclosure. As shown in FIG. 3A, a bottom metal layer BM is deposited on a substrate SUB, a top metal layer TM is deposited on the bottom metal layer BM, and a photoresist PR is formed on the bottom metal layer BM. The bottom metal layer BM and the top metal layer TM may be identical or similar to those in FIG. 2A. A material of the photoresist PR is positive tone photoresist. First regions of the photoresist PR are exposed with a first exposure dose E1 of light. A second region of the photoresist PR is exposed with a second exposure dose E2 of light which is smaller than the first exposure dose E1. Third regions of the photoresist PR are not exposed. In some embodiments, the photoresist PR may be exposed by UV light, but the present disclosure is not limited in this regard. In some embodiments, the photoresist PR may be exposed by using a gray-tone mask (or a half-tone mask). For example, the half-tone mask may include full exposed portions where the full intensity of light (i.e., the first exposure dose E1) would be transmitted, half tone portions where parts of the light (e.g., the second exposure dose E2, which may be 20% to 60% of the first exposure dose E1) would be transmitted, and full tone portions where the light would be perfectly blocked.

Reference is made to FIG. 3B. FIG. 3B is a schematic cross-sectional view of an intermediate stage of a method of manufacturing a structure having multi metal layers according to some embodiments of the present disclosure. The intermediate stage shown in FIG. 3A may be sequentially followed by the intermediate stage shown in FIG. 3B. As shown in FIG. 3B, the exposed photoresist PR is then developed to form a patterned photoresist PR'. The patterned photoresist PR' has a first mask portion PR11 and a second mask portion PR12. The second mask portion PR12 is thicker than the first mask portion PR11. The patterned photoresist PR' has first hollow portions H1 which expose parts of top surface of the top metal layer TM. It can be seen that the regions of the photoresist PR exposed with the first exposure dose E1 will be entirely removed, the regions of the photoresist PR exposed with the second exposure dose E2 will be partially removed to form the first mask portion PR11, and the regions of the photoresist PR not exposed will be originally remained to form the second mask portion PR12.

Reference is made to FIG. 3C. FIG. 3C is a schematic cross-sectional view of an intermediate stage of a method of manufacturing a structure having multi metal layers according to some embodiments of the present disclosure. The intermediate stage shown in FIG. 3B may be sequentially followed by the intermediate stage shown in FIG. 3C. As shown in FIG. 3C, the top metal layer TM and the bottom metal layer BM are etched through first hollow portions H1 of the patterned photoresist PR' to respectively form a top metal pattern TP and a bottom metal pattern BP.

Figure 3D:
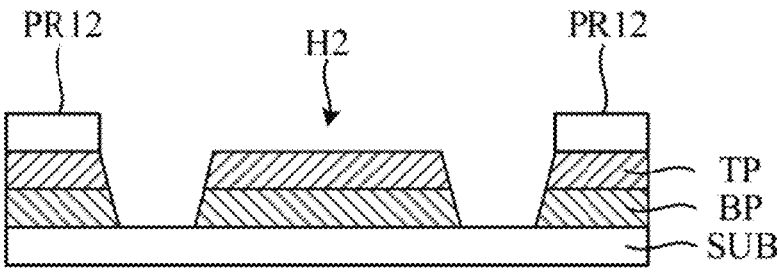

Reference is made to FIG. 3D. FIG. 3D is a schematic cross-sectional view of an intermediate stage of a method of manufacturing a structure having multi metal layers according to some embodiments of the present disclosure. The intermediate stage shown in FIG. 3C may be sequentially followed by the intermediate stage shown in FIG. 3D. As shown in FIG. 3D, a second hollow portion H2 is formed in the patterned photoresist PR' to expose a portion of the top surface of the top metal pattern TP. Specifically, the first mask portion PR11 is removed to expose the portion of the top surface of the top metal pattern TP. In some embodiments, an ashing process is performed to the first mask portion PR11 and the second mask portion PR12 until the first mask portion PR11 is entirely removed and the remaining second mask portion PR12 still covers the top surface of the top metal pattern TP. In other words, the second hollow portion H2 is formed by the remaining second mask portion PR12. In some embodiments, oxygen plasma is used in the ashing process to perform the erosion of the first mask portion PR11 and the second mask portion PR12.

Figure 3E:
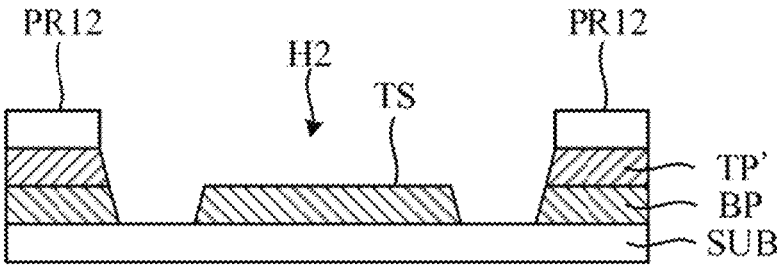

Reference is made to FIG. 3E. FIG. 3E is a schematic cross-sectional view of an intermediate stage of a method of manufacturing a structure having multi metal layers according to some embodiments of the present disclosure. The intermediate stage shown in FIG. 3D may be sequentially followed by the intermediate stage shown in FIG. 3E. As shown in FIG. 3E, the top metal pattern TP is etched through the second hollow portion H2 until the top surface portion TS of the bottom metal pattern BP in the second hollow portion H2 is exposed by the etched top metal pattern TP'. In some embodiments, an etch selectivity of the top metal layer TM and the bottom metal layer BM in the etching is greater than 1.0. In some other embodiments, the etch selectivity of the top metal layer TM and the bottom metal layer BM in the etching is greater than 2.0. In this way, the etching depth can be better controlled.

In the embodiment where the bottom metal layer BM contains aluminum and the top metal layer TM contains copper, a wet etching process may be performed to etch the top metal layer TM. In some embodiments, a hydrogen peroxide-based etchant may be used in the wet etching process.

In the embodiment where the bottom metal layer BM contains aluminum and the top metal layer TM contains molybdenum, a wet etching process may be performed to etch the top metal layer TM. In some embodiments, a hydrogen peroxide-based etchant may be used in the wet etching process. For example, the etchant may contain a mixture of citric acid and hydrogen peroxide.

In some embodiments, a barrier metal layer (not shown) may be formed between the bottom metal layer BM and the top metal layer TM which contains copper. For example, the barrier metal layer may be a molybdenum-containing barrier layer. In general, the etchant for etching the top metal layer TM which contains copper may also be used to etch the barrier metal layer. For example, in the specific embodiment where the bottom metal layer BM, the top metal layer TM, and the barrier metal layer respectively contain aluminum, copper, and molybdenum, the etchant which contains a mixture of sulfuric acid ($H_2SO_4$) and hydrogen peroxide may be used to etch the top metal layer TM and the barrier metal layer without etching the bottom metal layer BM.

Figure 3F:
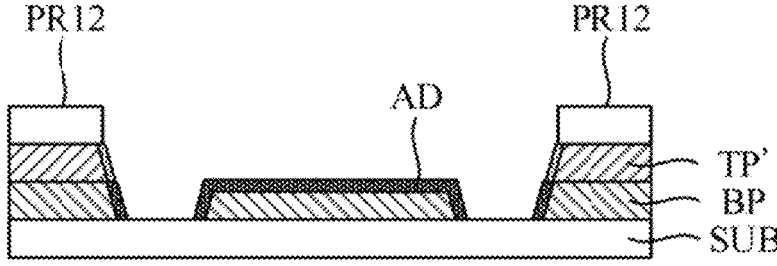

Reference is made to FIG. 3F. FIG. 3F is a schematic cross-sectional view of an intermediate stage of a method of manufacturing a structure having multi metal layers according to some embodiments of the present disclosure. The intermediate stage shown in FIG. 3E may be sequentially followed by the intermediate stage shown in FIG. 3F. As shown in FIG. 3F, the top surface portion TS is anodized to form an anodized part AD of the bottom metal pattern BP. In some embodiments, as shown in FIG. 3F, the anodization of side walls of the etched top metal pattern TP' will not affect the functionality of this invention, thus we do not consider it here, but the disclosure is not limited in this regard.

Figure 4:
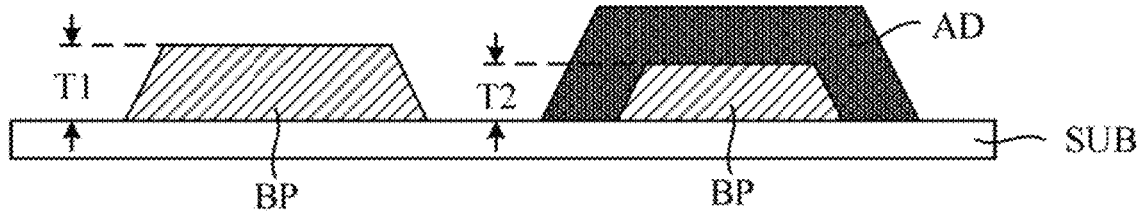
FIG. 4 is a schematic cross-sectional view of a part of a bottom metal pattern before and after being anodized according to some embodiments of the present disclosure.

FIG. 4 is a schematic cross-sectional view of a part of the bottom metal pattern BP before and after being anodized according to some embodiments of the present disclosure. As shown in FIG. 4, in some embodiments, a thickness T2 of the unanodized part of the anodized bottom metal pattern BP is equal to or greater than $1/10$ of a thickness T1 of the bottom metal pattern BP before being anodized. In this way, the resistance of the e bottom metal pattern BP will not be too large.

In some embodiments, the method of manufacturing a structure having multi metal layers of the present disclosure may be used to manufacture a thin-film transistor, which can be exemplified by FIG. 5A to FIG. 5K.

Figure 5A:
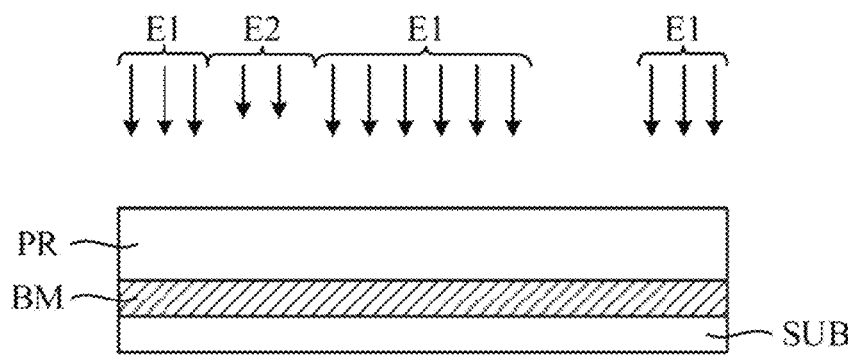
FIGS. 5A to 5K are schematic cross-sectional views of intermediate stages of a method of manufacturing a structure having multi metal layers according to some embodiments of the present disclosure.

Reference is made to FIG. 5A. FIG. 5A is a schematic cross-sectional view of an intermediate stage of a method of manufacturing a structure having multi metal layers according to some embodiments of the present disclosure. As shown in FIG. 5A, a bottom metal layer BM is formed on a substrate SUB, and a photoresist PR is formed on the bottom metal layer BM. An atomic ratio of aluminum in the bottom metal layer BM is greater than 50%. A material of the photoresist PR is positive tone photoresist. First regions of the photoresist PR are exposed with a first exposure dose E1 of light. Second regions of the photoresist PR are exposed with a second exposure dose E2 of light which is smaller than the first exposure dose E1. Third regions of the photoresist PR are not exposed. In some embodiments, the photoresist PR may be exposed by UV light, but the present disclosure is not limited in this regard. In some embodiments, the photoresist PR may be exposed by using a gray-tone mask (or a half-tone mask). For example, the half-tone mask may include full exposed portions where the full intensity of light (i.e., the first exposure dose E1) would be transmitted, half tone portions where parts of the light (e.g., the second exposure dose E2, which may be 20% to 60% of the first exposure dose E1) would be transmitted, and full tone portions where the light would be perfectly blocked.

Figure 5B:
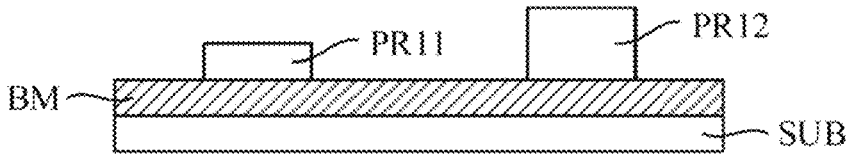

Reference is made to FIG. 5B. FIG. 5B is a schematic cross-sectional view of an intermediate stage of a method of manufacturing a structure having multi metal layers according to some embodiments of the present disclosure. The intermediate stage shown in FIG. 5A may be sequentially followed by the intermediate stage shown in FIG. 5B. As shown in FIG. 5B, the exposed photoresist PR is then developed to form a first patterned photoresist PR1. The first patterned photoresist PR1 has a first mask portion PR11 and a second mask portion PR12. The second mask portion PR12 is thicker than the first mask portion PR11. It can be seen that the regions of the photoresist PR exposed with the first exposure dose E1 will be entirely removed, the regions of the photoresist PR exposed with the second exposure dose E2 will be partially removed to form the first mask portion PR11, and the regions of the photoresist PR not exposed will be originally remained to form the second mask portion PR12.

Figure 5C:
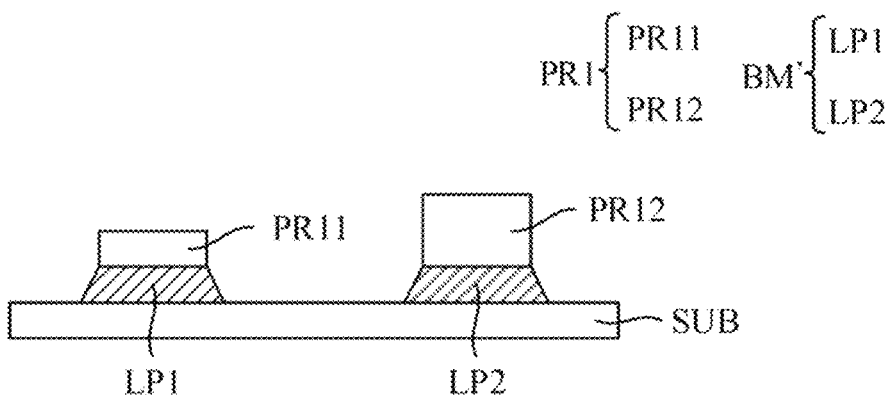

Reference is made to FIG. 5C. FIG. 5C is a schematic cross-sectional view of an intermediate stage of a method of manufacturing a structure having multi metal layers according to some embodiments of the present disclosure. The intermediate stage shown in FIG. 5B may be sequentially followed by the intermediate stage shown in FIG. 5C. As shown in FIG. 5C, the bottom metal layer BM is etched through the first patterned photoresist PR1 to form a first lower metal pattern LP1 and a second lower metal pattern LP2 that are respectively covered by the first mask portion PR11 and the second mask portion PR12.

In some embodiments, a wet etching process may be performed to etch the bottom metal layer BM. In some embodiments, a PAN etchant (a mixture of phosphoric acid, acetic acid, nitric acid, and water) may be used in the wet etching process. For example, a mixing ratio of phosphoric acid, acetic acid, nitric acid, and water may be 16:1:1:2, but the present disclosure is not limited in this regard. In some other embodiments, hydrogen peroxide and sulfuric acid may be used in the wet etching process.

In some embodiments, a dry etching process may be performed to etch the bottom metal layer BM. For example, the dry etching process may be an ECCP (Enhanced Capacitance Coupled Plasma) process using, for example, Cl2 and BCl3, but the present disclosure is not limited in this regard.

Figure 5D:
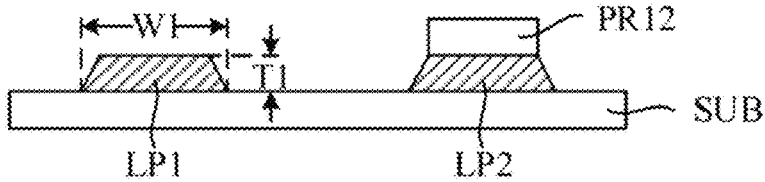

Reference is made to FIG. 5D. FIG. 5D is a schematic cross-sectional view of an intermediate stage of a method of manufacturing a structure having multi metal layers according to some embodiments of the present disclosure. The intermediate stage shown in FIG. 5C may be sequentially followed by the intermediate stage shown in FIG. 5D. As shown in FIG. 5D, the first mask portion PR11 is removed to expose the top surfaces of the first lower metal pattern LP1. In some embodiments, an ashing process is performed to the first mask portion PR11 and the second mask portion PR12 until the first mask portion PR11 is entirely removed and the second mask portion PR12 still covers the top surface of the second lower metal pattern LP2. In some embodiments, oxygen plasma is used in the ashing process to perform the erosion of the first mask portion PR11 and the second mask portion PR12.

Figure 5E:
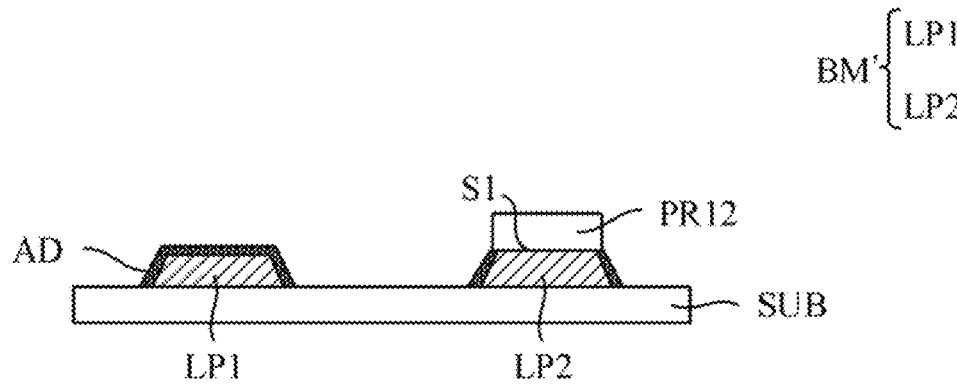

Reference is made to FIG. 5E. FIG. 5E is a schematic cross-sectional view of an intermediate stage of a method of manufacturing a structure having multi metal layers according to some embodiments of the present disclosure. The intermediate stage shown in FIG. 5D may be sequentially followed by the intermediate stage shown in FIG. 5E. As shown in FIG. 5E, the etched bottom metal layer BM' is anodized. The first lower metal pattern LP1 and the second lower metal pattern LP2 are partially anodized after the anodizing and thus have anodized parts AD (i.e., anodic oxide). The anodized second lower metal pattern LP2 has a surface portion S1 that is unanodized and in contact with the second mask portion PR12.

In some embodiments, the etched bottom metal layer BM' is anodized to reach a termination voltage. Each of the first lower metal pattern LP1 and the second lower metal pattern LP2 has a thickness T1 (e.g., a vertical length of the first lower metal pattern LP1 in FIG. 5D) and a width W1 (e.g., a lateral length of the first lower metal pattern LP1 in FIG. 5D) before being anodized, and the termination voltage is less than a smallest one of the thickness T1 and the width W1 in nm divided by 0.9 nm-$V^{-1}$. In this way, the etched bottom metal layer BM' will not be fully anodized and leave conductive parts.

In some embodiments, the width W1 of the first lower metal pattern LP1 is greater than the thickness T1 of the first lower metal pattern LP1, but the disclosure is not limited in this regard.

In some embodiments, the termination voltage that the etched bottom metal layer BM' is anodized to reach is greater than 10 Volt and smaller than 500 Volt. It should be pointed out that if the etched bottom metal layer BM' is anodized to reach a termination voltage greater than 500 Volt, the thickness of the anodized parts AD of the etched bottom metal layer BM' (e.g., the anodized part AD of the first lower metal pattern LP1) may be too thick and result in high operation voltage of thin-film transistors.

In some embodiments, the etched bottom metal layer BM' is anodized by applying a constant current greater than 0.5 mA/$cm^2$. In some embodiments, the constant current is between 0.05 mA/$cm^2$ and 5 mA/$cm^2$.

In some embodiments, the etched bottom metal layer BM' is anodized until the termination voltage is reached and kept for at least 300 seconds. It makes more uniform thickness of the anodized parts AD of the etched bottom metal layer BM'.

In some embodiments, an annealing process may be performed to the anodized bottom metal layer BM'. In this way, the resistance of the anodized bottom metal layer BM' (e.g., the anodized part AD of the anodized first lower metal pattern LP1) to a second wet etching process (if any) can be increased. In some embodiments, an annealing temperature used in the annealing process is greater than 200° C., but the disclosure is not limited in this regard.

In some embodiments, the etched bottom metal layer BM' is anodized by using an electrolyte with a pH value between pH5 and pH8. It should be pointed out that if the pH value is smaller than pH5 or greater than pH8, there will be more pores in the anodized parts AD of the etched bottom metal layer BM'.

In some embodiments, the etched bottom metal layer BM' is anodized by using an electrolyte containing a content of water less than 45 wt %. In this way, the Hydrogen content in the anodized parts AD of the etched bottom metal layer BM' can be small. The Hydrogen content may reduce the breakdown voltage of the gate insulator. Hydrogen sometimes affects the semiconductor layer A and reduces its stability.

In some embodiments, the etched bottom metal layer BM' is anodized by using an electrolyte containing water, ethylene glycol, and ammonium tartrate. For example, the electrolyte may contain ethylene glycol of about 68.5 wt %, water of about 30 wt %, and ammonium tartrate of about 1.5 wt %, but the disclosure is not limited in this regard.

In some embodiments, the etched bottom metal layer BM' is anodized at a temperature under 15° C. In this way, the anodized parts AD of the etched bottom metal layer BM' will be denser and thus the quality can be improved.

Figure 5F:
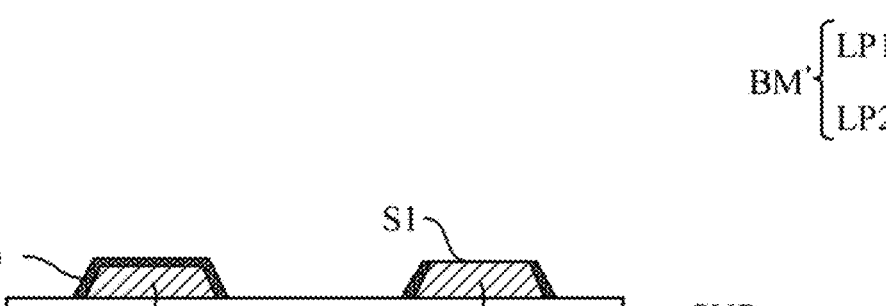

Reference is made to FIG. 5F. FIG. 5F is a schematic cross-sectional view of an intermediate stage of a method of manufacturing a structure having multi metal layers according to some embodiments of the present disclosure. The intermediate stage shown in FIG. 5E may be sequentially followed by the intermediate stage shown in FIG. 5F. As shown in FIG. 5F, the second mask portion PR12 is removed to expose the surface portion S1 of the second lower metal pattern LP2 that is unanodized.

Figure 5G:
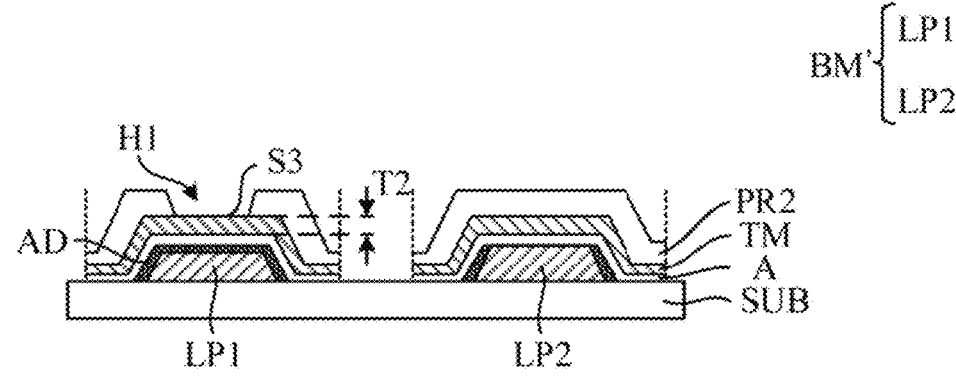

Reference is made to FIG. 5G. FIG. 5G is a schematic cross-sectional view of an intermediate stage of a method of manufacturing a structure having multi metal layers according to some embodiments of the present disclosure. To further manufacture a thin-film transistor, the intermediate stage shown in FIG. 5F may be sequentially followed by the intermediate stage shown in FIG. 5G. As shown in FIG. 5G, a semiconductor layer A is deposited on the anodized bottom metal layer BM' to cover the first lower metal pattern LP1 and the second lower metal pattern LP2, such that the first lower metal pattern LP1 and the second lower metal pattern LP2 are in contact with the semiconductor layer A. The first lower metal pattern LP1 serves as a gate electrode, and the anodized part AD of the anodized first lower metal pattern LP1 serves as a gate insulator.

In some embodiments, the semiconductor layer A is an oxide semiconductor layer. In addition, the semiconductor layer A includes at least one element of aluminum, gallium, indium, zinc, tin, and zirconium, but the disclosure is not limited in this regard. In some other embodiments, the semiconductor layer A includes $MoS_2$.

In some embodiments, the semiconductor layer A may be deposited by a PVD (Physical Vapor Deposition) process or a CVD (Chemical Vapor Deposition) process.

In some embodiments, the semiconductor layer A may be a multi-layer structure containing different compositions. For example, the semiconductor layer A may be a double-layer structure including IZO (indium gallium zinc oxide) and IGZTO (indium gallium zinc tin oxide), but the disclosure is not limited in this regard. In this way, the channel mobility can be improved.

As shown in FIG. 5G, a top metal layer TM is deposited on the semiconductor layer A. It should be pointed out that a surface of the top metal layer TM in contact with the semiconductor layer A contains metal that can be anodized (e.g., aluminum). The combination of the semiconductor layer A and the top metal layer TM serves as a conductive layer. A second patterned photoresist PR2 is formed on the top metal layer TM. The formation method of the second patterned photoresist PR2 may be the same as or similar to that of the first patterned photoresist PR1, so the formation of the second patterned photoresist PR2 can be referred to the description about FIGS. 5A and 5B and will not be repeated here. The second patterned photoresist PR2 has a first hollow portion H1 exposing a surface portion S3 of the top metal layer TM.

In some embodiments, the step of depositing the semiconductor layer A and the step of depositing the top metal layer TM are performed continuously in vacuum That is, the semiconductor layer A does not come into contact with the atmosphere before the top metal layer TM is deposited. In some other embodiments, the step of depositing the semiconductor layer A and the step of depositing the top metal layer TM are performed in chambers with transferring in vacuum. In this way, the oxide semiconductor layer A can be prevented from contacting with air.

Figure 5H:
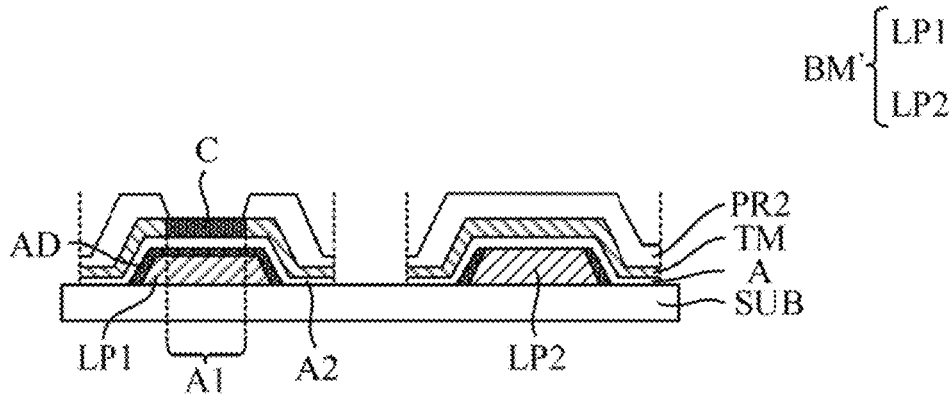

Reference is made to FIG. 5H. FIG. 5H is a schematic cross-sectional view of an intermediate stage of a method of manufacturing a structure having multi metal layers according to some embodiments of the present disclosure. The intermediate stage shown in FIG. 5G may be sequentially followed by the intermediate stage shown in FIG. 5H. As shown in FIG. 5H with reference to FIG. 5G, the surface portion S3 of the top metal layer TM is anodized through the second patterned photoresist PR2 until the top metal layer TM has an anodized segment C (i.e., anodic oxide) extended from the surface portion S3 of the top metal layer TM to a side of the top metal layer TM facing the semiconductor layer A. As mentioned above, the surface of the top metal layer TM in contact with the semiconductor layer A contains metal that can be anodized (e.g., aluminum), so that the top metal layer TM can be anodized to extend the anodized segment C to reach the side of the top metal layer TM facing the semiconductor layer A.

In some embodiments, the surface portion S3 of the top metal layer TM is anodized to reach a termination voltage. The top metal layer TM has a thickness T2 before being anodized, as shown in FIG. 5G. The termination voltage is greater than the thickness T2 in nm divided by 1.0 $nm\text{-}V^{-1}$. In this way, it can be ensured that the anodized segment C can reach the side of the top metal layer TM facing the semiconductor layer A.

In some embodiments, as shown in FIG. 5H, the semiconductor layer A has an active area A1 and an inactive area A2. The active area A1 is covered by and in contact with the anodized segment C. The active area A1 may be defined by a vertical projection of the anodized segment C projected on the semiconductor layer A. The inactive area A2 is covered by and in contact with the other conductive segment of the top metal layer TM. In order to reduce the contact resistance of the inactive area A2 relative to the top metal layer TM, an annealing process may be performed to make the inactive area A2 react with aluminum in the top metal layer TM. Aluminum increases the oxygen vacancies of the inactive area A2 of the semiconductor layer A. The annealing process also improves the stability of the active area A1 of the semiconductor layer A.

Figure 5I:
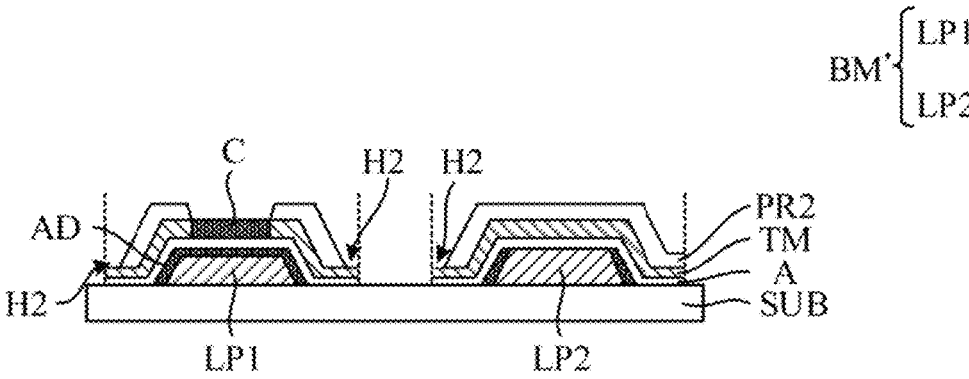

Reference is made to FIG. 5I. FIG. 5I is a schematic cross-sectional view of an intermediate stage of a method of manufacturing a structure having multi metal layers according to some embodiments of the present disclosure. The intermediate stage shown in FIG. 5H may be sequentially followed by the intermediate stage shown in FIG. 5I. As shown in FIG. 5I, second hollow portions H2 are formed in the second patterned photoresist PR2. In some embodiments, an ashing process is performed to the second patterned photoresist PR2 until the second hollow portions H2 are formed to expose portions of the top metal layer TM. In some embodiments, oxygen plasma is used in the ashing process to perform the erosion of the second patterned photoresist PR2.

Figure 5J:
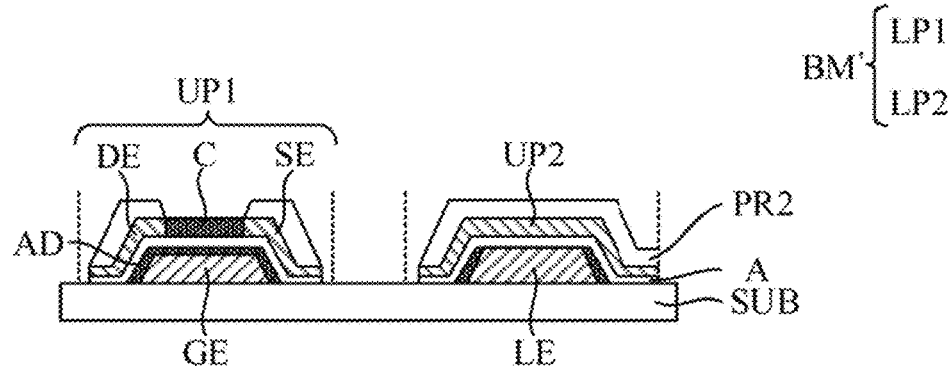

Reference is made to FIG. 5J. FIG. 5J is a schematic cross-sectional view of an intermediate stage of a method of manufacturing a structure having multi metal layers according to some embodiments of the present disclosure. The intermediate stage shown in FIG. 5I may be sequentially followed by the intermediate stage shown in FIG. 5J. As shown in FIG. 5J, the top metal layer TM is etched through the second hollow portions H2 to form a first upper metal pattern UP1 and a second upper metal pattern UP2. The first upper metal pattern UP1 is above the anodized first lower metal pattern LP1 and has a drain electrode DE and a source electrode SE. The drain electrode DE and the source electrode SE are connected to the anodized segment C and electrically isolated from each other by the anodized segment C. The anodized segment C serves as a channel protect structure. The second upper metal pattern UP2 is above the second lower metal pattern LP2. The second upper metal pattern UP2 forms a contact structure with the second lower metal pattern LP2.

In some embodiments, an etch selectivity of the top metal layer TM and the anodized segment C in the step of etching the top metal layer TM (as shown in FIG. 5J) is higher than 2.0.

Figure 5K:
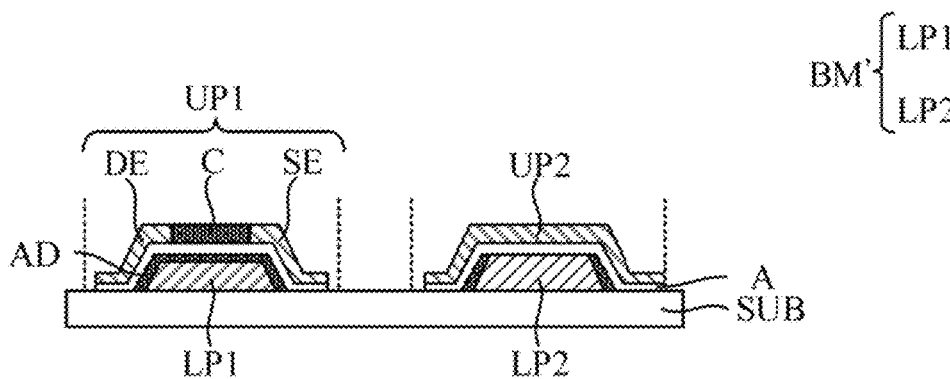

Reference is made to FIG. 5K. FIG. 5K is a schematic cross-sectional view of an intermediate stage of a method of manufacturing a structure having multi metal layers according to some embodiments of the present disclosure. The intermediate stage shown in FIG. 5J may be sequentially followed by the intermediate stage shown in FIG. 5K. As shown in FIG. 5K, the second patterned photoresist PR2 is removed to expose the first upper metal pattern UP1 and the second upper metal pattern UP2.

In some embodiments, a thickness of the semiconductor layer A is equal to or smaller than 100 nm. In this way, the back channel leakage may be reduced in certain circumstances. In addition, the problem of excessive contact resistance between the semiconductor layer A and other layers in contact with the semiconductor layer A (i.e., the second lower metal pattern LP2, the second upper metal pattern UP2, the drain electrode DE, and the source electrode SE) can be avoided.

Figure 6:
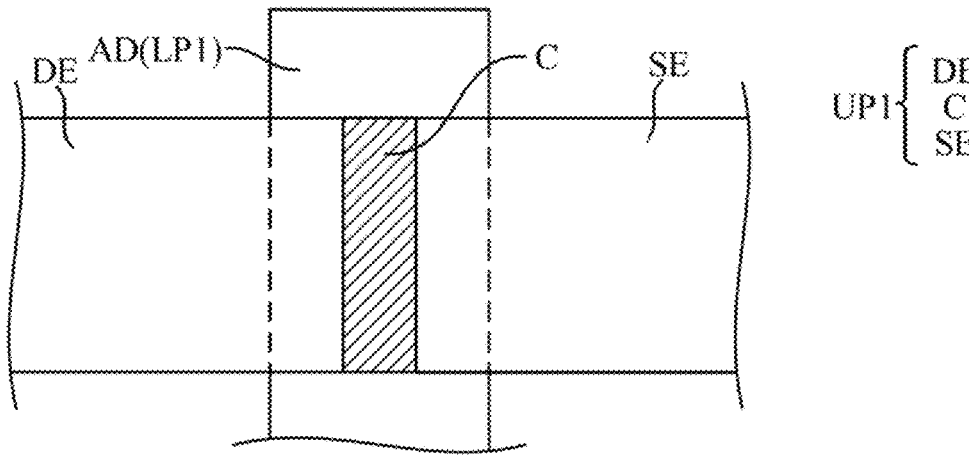
FIG. 6 is a partial top view of the structure shown in FIG. 5K according to some embodiments of the present disclosure.
Figure 7A:
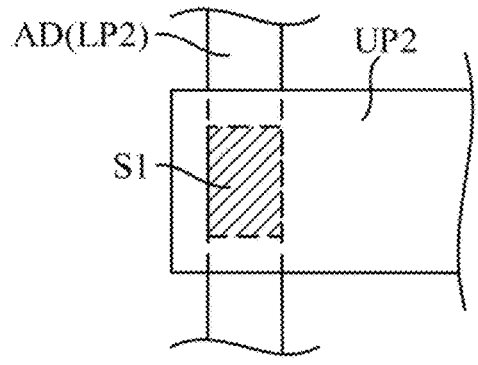
FIG. 7A is another partial top view of the structure shown in FIG. 5K according to some embodiments of the present disclosure.

Reference is made to FIGS. 6 and 7A. FIGS. 6 and 7A are partial top views of the structure shown in FIG. 5K according to some embodiments of the present disclosure. In detail, FIG. 6 is a partial schematic diagram showing the anodized first lower metal pattern LP1 (covered by the anodized part AD) and the first upper metal pattern UP1. FIG. 7A is a partial schematic diagram showing the anodized second lower metal pattern LP2 (covered by the anodized part AD and exposing the surface portion S1) and the second upper metal pattern UP2 that form the aforementioned contact structure.

Figure 7B:
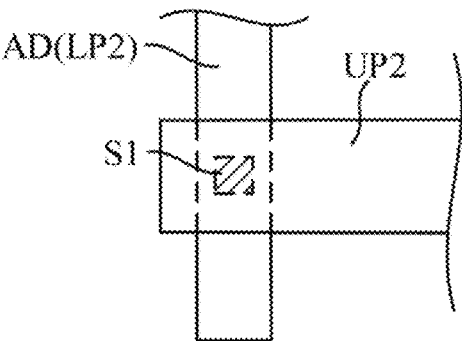
FIG. 7B is another partial top view of the structure shown in FIG. 5K according to some embodiments of the present disclosure.

Reference is made to FIG. 7B. FIG. 7B is another partial top view of the structure shown in FIG. 5K according to some embodiments of the present disclosure. As shown in FIG. 7B, the surface portion S1 of the second lower metal pattern LP2 exposed by the anodized part AD has a smaller area than that shown in FIG. 7A.

Figure 7C:
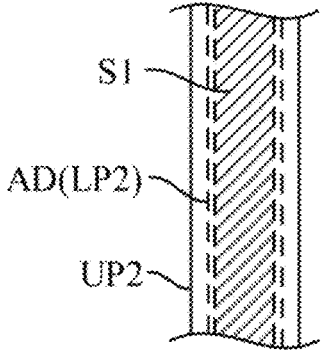
FIG. 7C is another partial top view of the structure shown in FIG. 5K according to some embodiments of the present disclosure.

Reference is made to FIG. 7C. FIG. 7C is another partial top view of the structure shown in FIG. 5K according to some embodiments of the present disclosure. As shown in FIG. 7C, both the surface portion S1 of the second lower metal pattern LP2 exposed by the anodized part AD and the second upper metal pattern UP2 covering the second lower metal pattern LP2 are extended along the second lower metal pattern LP2.

Accordingly, it can be seen that the method of manufacturing a structure having multi metal layers of the embodiments as shown in FIGS. 5A to 5K can be used to manufacture a thin-film transistor by only using two sets of PEP. Therefore, the cost of manufacturing a thin-film transistor can be significantly reduced and the manufacturing efficiency can be effectively enhanced.

Figure 8A:
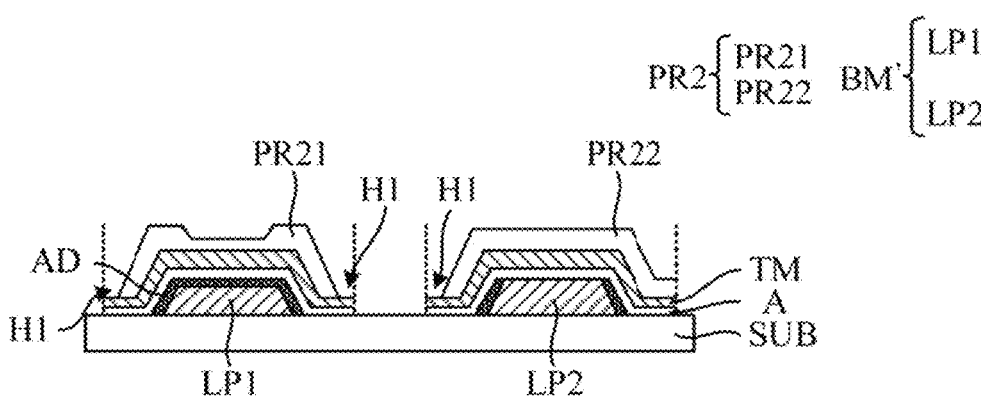
FIGS. 8A to 8E are schematic cross-sectional views of intermediate stages of a method of manufacturing a structure having multi metal layers according to some embodiments of the present disclosure.

Reference is made to FIG. 8A. FIG. 8A is a schematic cross-sectional view of an intermediate stage of a method of manufacturing a structure having multi metal layers according to some embodiments of the present disclosure. In some embodiments, the intermediate stage shown in FIG. 5F may be directly followed by the intermediate stage shown in FIG. 8A. As shown in FIG. 8A, a semiconductor layer A is deposited on the anodized bottom metal layer BM', and a top metal layer TM is deposited on the semiconductor layer A. The deposition methods of the semiconductor layer A and the top metal layer TM may be the same as or similar to those of the embodiments as shown in FIG. 5G, so they can be referred to the description about FIG. 5G and will not be repeated here.

As shown in FIG. 8A, a second patterned photoresist PR2 is formed on the top metal layer TM. The formation method of the second patterned photoresist PR2 may be the same as or similar to that of the first patterned photoresist PR1, so the formation of the second patterned photoresist PR2 can be referred to the description about FIGS. 5A and 5B and will not be repeated here. The second patterned photoresist PR2 has first hollow portions H1 exposing portions of the top metal layer TM.

Figure 8B:
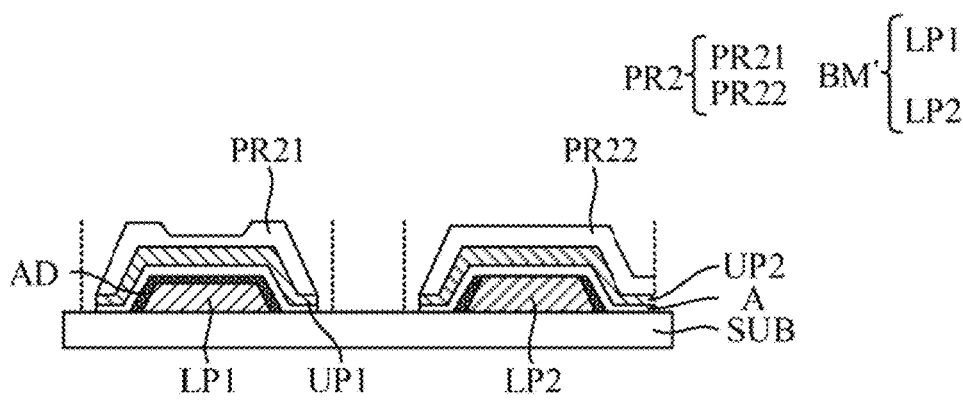

Reference is made to FIG. 8B. FIG. 8B is a schematic cross-sectional view of an intermediate stage of a method of manufacturing a structure having multi metal layers according to some embodiments of the present disclosure. The intermediate stage shown in FIG. 8A may be sequentially followed by the intermediate stage shown in FIG. 8B. As shown in FIG. 8B, the top metal layer TM is etched through the second patterned photoresist PR2 to form a first upper metal pattern UP1 and a second upper metal pattern UP2. The first upper metal pattern UP1 is above the anodized first lower metal pattern LP1 and covered by a first mask portion PR21 of the second patterned photoresist PR2. The second upper metal pattern UP2 is above the anodized second lower metal pattern LP2 and covered by a second mask portion PR22 of the second patterned photoresist PR2.

Figure 8C:
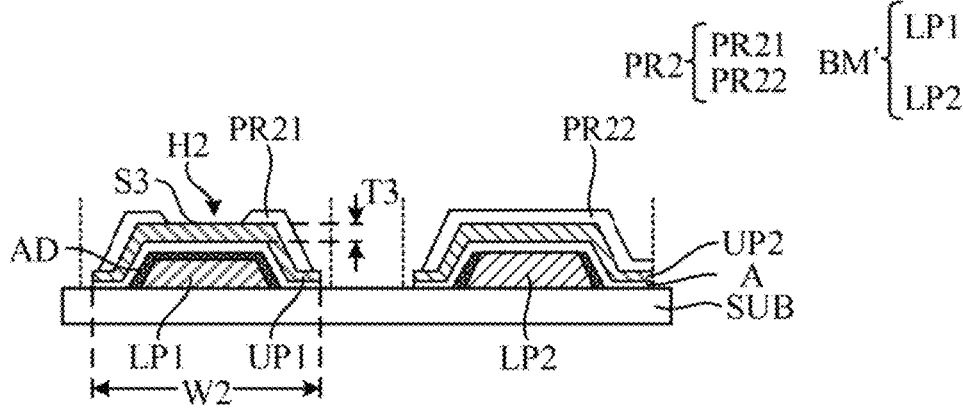

Reference is made to FIG. 8C. FIG. 8C is a schematic cross-sectional view of an intermediate stage of a method of manufacturing a structure having multi metal layers according to some embodiments of the present disclosure. The intermediate stage shown in FIG. 8B may be sequentially followed by the intermediate stage shown in FIG. 8C. As shown in FIG. 8C, a part of the first mask portion PR21 of the second patterned photoresist PR2 is removed to form a second hollow portion H2. The second hollow portion H2 exposes a surface portion S3 of the first upper metal pattern UP1. In some embodiments, an ashing process is performed to the second patterned photoresist PR2 until the second hollow portion H2 is formed to expose the surface portion S3 of the first upper metal pattern UP1. In some embodiments, oxygen plasma is used in the ashing process to perform the erosion of the second patterned photoresist PR2.

Figure 8D:
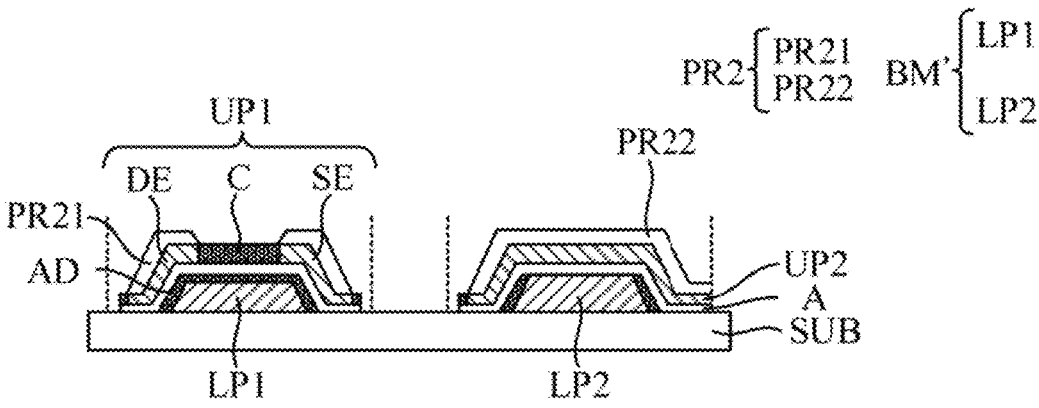

Reference is made to FIG. 8D. FIG. 8D is a schematic cross-sectional view of an intermediate stage of a method of manufacturing a structure having multi metal layers according to some embodiments of the present disclosure. The intermediate stage shown in FIG. 8C may be sequentially followed by the intermediate stage shown in FIG. 8D. As shown in FIG. 8D, the surface portion S3 of the first upper metal pattern UP1 is anodized until the first upper metal pattern UP1 has a drain electrode DE, a source electrode SE, and an anodized segment C connected between and electrically isolating the drain electrode DE and the source electrode SE. The anodized segment C serves as a channel protect structure.

In some embodiments, the etched bottom metal layer BM' is anodized to reach a termination voltage. The first lower metal pattern LP1 has a thickness T1 (e.g., a vertical length of the first lower metal pattern LP1 in FIG. 5D) before being anodized, and the termination voltage is less than the thickness T1 in nm divided by 0.9 nm-$V^{-1}$. In this way, the etched bottom metal layer BM' will not be fully anodized and leave conductive parts.

In some embodiments, the surface portion S3 of the first upper metal pattern UP1 is anodized to reach a termination voltage. The first upper metal pattern UP1 has a width W2 and a thickness T3 before being anodized, as shown in FIG. 8C. The termination voltage is greater than a smallest one of the width W2 and the thickness T2 in nm divided by 1.0 nm-$V^{-1}$. In this way, it can be ensured that the anodized segment C can reach the side of the first upper metal pattern UP1 facing the semiconductor layer A, as shown in FIG. 8D.

Figure 8E:
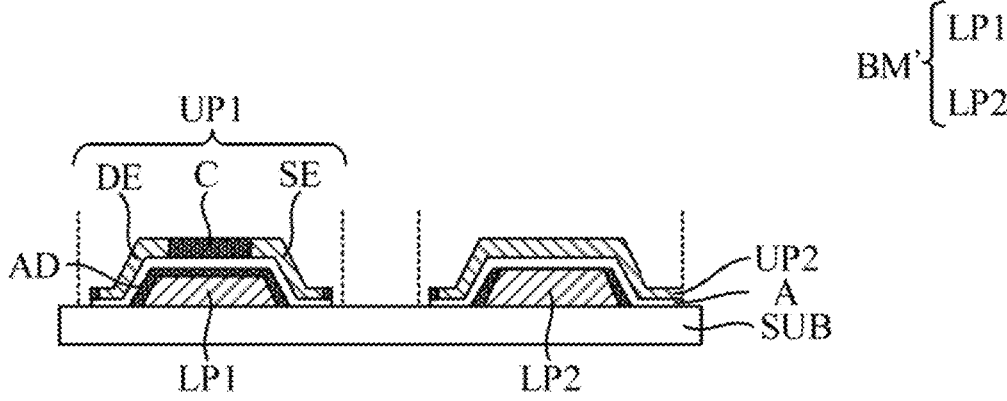

Reference is made to FIG. 8E. FIG. 8E is a schematic cross-sectional view of an intermediate stage of a method of manufacturing a structure having multi metal layers according to some embodiments of the present disclosure. The intermediate stage shown in FIG. 8D may be sequentially followed by the intermediate stage shown in FIG. 8E. As shown in FIG. 8E, the second patterned photoresist PR2 is removed to expose the first upper metal pattern UP1 and the second upper metal pattern UP2.

Reference is made to FIG. 9A. FIG. 9A is a schematic cross-sectional view of an intermediate stage of a method of manufacturing a structure having multi metal layers according to some embodiments of the present disclosure. In some embodiments, the intermediate stage shown in FIG. 5A may be directly followed by the intermediate stage shown in FIG. 9A. In other words, the bottom metal layer BM in FIG. 5A is replaced by a bottom metal layer BM-1 in FIG. 9A. As shown in FIG. 9A, the bottom metal layer BM-1 is a multi-layer structure. Specifically, the bottom metal layer BM-1 includes a first sub-layer SL1, a second sub-layer SL2, and a third sub-layer SL3. The first sub-layer SL1 contains aluminum. The second sub-layer SL2 is stacked on the first sub-layer SL1. The third sub-layer SL3 is stacked on the second sub-layer SL2.

In some embodiments, the second sub-layer SL2 contains molybdenum, but the disclosure is not limited in this regard. The second sub-layer SL2 which contains molybdenum can prevent the first sub-layer SL1 which contains aluminum from occurring hillock in the subsequent high temperature process. The anodization effect of molybdenum is not good, but it can be used as a barrier metal.

In some embodiments, the third sub-layer SL3 contains copper, but the disclosure is not limited in this regard. The third sub-layer SL3 which contains copper can increase the electrical conductivity of an entirety of the bottom metal layer BM-1. In some embodiments, the second sub-layer SL2 which contains molybdenum can serve as a barrier layer to prevent copper diffusion from the third sub-layer SL3 which contains copper.

In some other embodiments, the third sub-layer SL3 may contain a barrier metal such as tantalum, titanium, or tungsten, but the disclosure is not limited in this regard.

In some embodiments, one of the second sub-layer SL2 and the third sub-layer SL3 may be omitted. For example, in some embodiments, the bottom metal layer BM-1 may be a double-layer structure only including the first sub-layer SL1 and the second sub-layer SL2 which contains molybdenum. In some other embodiments, the bottom metal layer BM-1 may be a double-layer structure only including the first sub-layer SL1 and the third sub-layer SL3 which contains copper.

Reference is made to FIG. 9B. FIG. 9B is a schematic cross-sectional view of an intermediate stage of a method of manufacturing a structure having multi metal layers according to some embodiments of the present disclosure. The intermediate stage shown in FIG. 9A may be sequentially followed by the intermediate stage shown in FIG. 9B. As shown in FIG. 9B, the bottom metal layer BM-1 is etched through the first patterned photoresist PR1 to form a first lower metal pattern LP1 and a second lower metal pattern LP2. In addition, the first lower metal pattern LP1 and a second lower metal pattern LP2 are respectively covered by the first mask portion PR11 and the second mask portion PR12.

Reference is made to FIG. 9C. FIG. 9C is a schematic cross-sectional view of an intermediate stage of a method of manufacturing a structure having multi metal layers according to some embodiments of the present disclosure. The intermediate stage shown in FIG. 9B may be sequentially followed by the intermediate stage shown in FIG. 9C. As shown in FIG. 9C, the first mask portion PR11 is removed to expose a top surface of the third sub-layer SL3 of the first lower metal pattern LP1. The step of removing the first mask portion PR11 as shown in FIG. 9C is the same as or similar to that as shown in FIG. 5D, so it can be referred to the description about FIG. 5D and will not be repeated here.

Figure 9D:
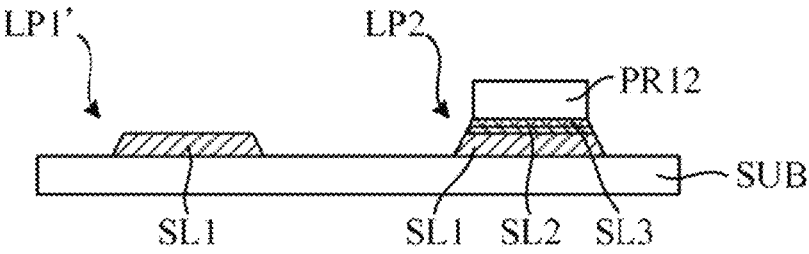

Reference is made to FIG. 9D. FIG. 9D is a schematic cross-sectional view of an intermediate stage of a method of manufacturing a structure having multi metal layers according to some embodiments of the present disclosure. The intermediate stage shown in FIG. 9C may be sequentially followed by the intermediate stage shown in FIG. 9D. As shown in FIG. 9D, the third sub-layer SL3 and the second sub-layer SL2 of the first lower metal pattern LP1 are selectively etched (relative to the first sub-layer SL1) to expose a top surface of the first sub-layer SL1. The remaining first sub-layer SL1 of the first lower metal pattern LP1 serves as a first lower metal pattern LP1'.

In some embodiments, the second sub-layer SL2 which contains molybdenum may be etched by using a solution containing hydrogen peroxide and citric acid.

In some embodiments, an etch selectivity of the second sub-layer SL2 and the first sub-layer SL1 in the selectively etching is higher than 2.0.

In some embodiments, the second sub-layer SL2 may be omitted. That is, the bottom metal layer BM-1 may only include the first sub-layer SL1 which contains aluminum and the third sub-layer SL3 which contains copper.

Figure 9E:
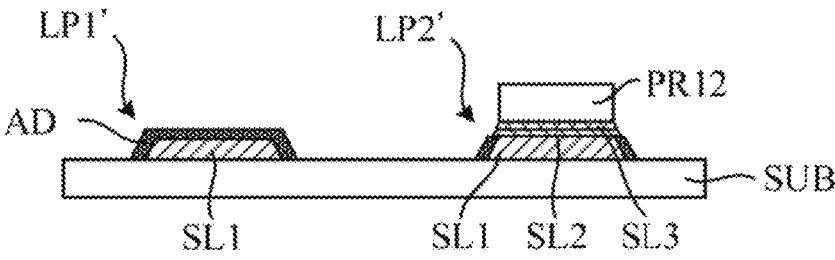

Reference is made to FIG. 9E. FIG. 9E is a schematic cross-sectional view of an intermediate stage of a method of manufacturing a structure having multi metal layers according to some embodiments of the present disclosure. The intermediate stage shown in FIG. 9D may be sequentially followed by the intermediate stage shown in FIG. 9E. As shown in FIG. 9E, the first lower metal pattern LP1 is anodized, and the second lower metal pattern LP2 is anodized to form a second lower metal pattern LP2'. The step of anodizing the first lower metal pattern LP1' and the second lower metal pattern LP2 as shown in FIG. 9E is the same as or similar to that as shown in FIG. 5E, so it can be referred to the description about FIG. 5E and will not be repeated here.

Figure 9F:
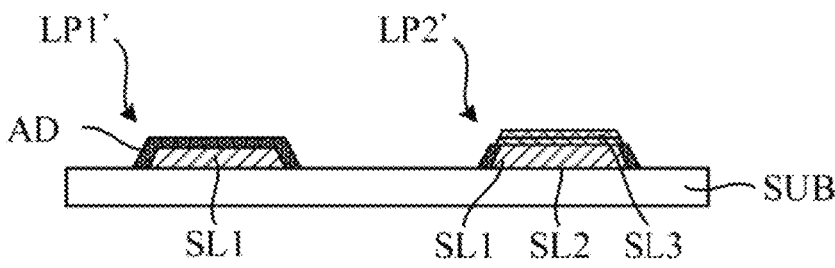

Reference is made to FIG. 9F. FIG. 9F is a schematic cross-sectional view of an intermediate stage of a method of manufacturing a structure having multi metal layers according to some embodiments of the present disclosure. The intermediate stage shown in FIG. 9E may be sequentially followed by the intermediate stage shown in FIG. 9F. As shown in FIG. 9F, the second mask portion PR12 is removed to expose a top surface of the third sub-layer SL3 of the second lower metal pattern LP2'. The step of removing the second mask portion PR12 as shown in FIG. 9F is the same as or similar to that as shown in FIG. 5F, so it can be referred to the description about FIG. 5F and will not be repeated here. In some embodiments, the intermediate stage shown in FIG. 9F may be sequentially followed by the intermediate stage shown in FIGS. 5G to 5K.

Figure 10A:
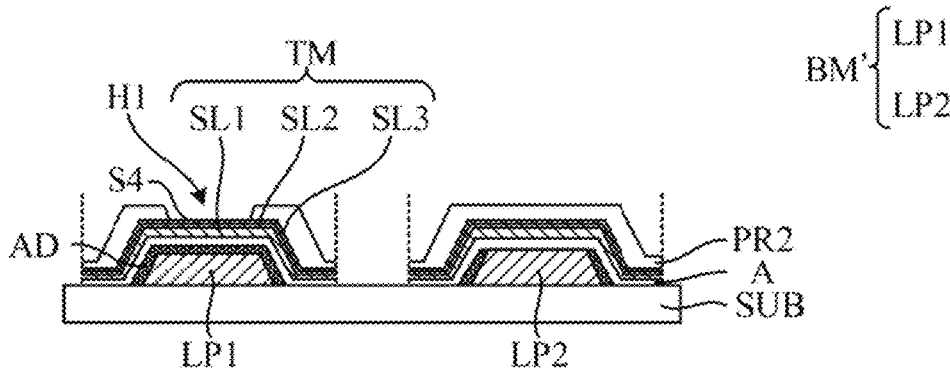
FIGS. 10A to 10C are schematic cross-sectional views of intermediate stages of a method of manufacturing a structure having multi metal layers according to some embodiments of the present disclosure.

Reference is made to FIG. 10A. FIG. 10A is a schematic cross-sectional view of an intermediate stage of a method of manufacturing a structure having multi metal layers according to some embodiments of the present disclosure. In some embodiments, the intermediate stage shown in FIG. 5F may be directly followed by the intermediate stage shown in FIG. 10A. As shown in FIG. 10A, a semiconductor layer A is deposited on the anodized bottom metal layer BM'. A top metal layer TM is deposited on the semiconductor layer A. A second patterned photoresist PR2 is formed on the top metal layer TM. In other words, the top metal layer TM in FIG. 5G is replaced by the top metal layer TM in FIG. 10A. As shown in FIG. 10A, the top metal layer TM is a multi-layer structure. Specifically, the top metal layer TM includes a first sub-layer SL1, a second sub-layer SL2, and a third sub-layer SL3. The first sub-layer SL1 contains aluminum. The second sub-layer SL2 is stacked on the first sub-layer SL1. The third sub-layer SL3 is stacked on the second sub-layer SL2. In addition, the second patterned photoresist PR2 has a first hollow portion H1 exposing a surface portion S4 of the top metal layer TM. The surface portion S4 is a portion of the top surface of the third sub-layer SL3 right above the first lower metal pattern LP1.

In some embodiments, the second sub-layer SL2 contains molybdenum, but the disclosure is not limited in this regard. The second sub-layer SL2 which contains molybdenum can prevent the first sub-layer SL1 which contains aluminum from occurring hillock in the subsequent high temperature process.

In some embodiments, the third sub-layer SL3 contains copper, but the disclosure is not limited in this regard.

In some embodiments, one of the second sub-layer SL2 and the third sub-layer SL3 may be omitted.

In some embodiments, the step of depositing the semiconductor layer A as shown in FIG. 10A is the same as or similar to that as shown in FIG. 5G, so it can be referred to the description about FIG. 5G and will not be repeated here. In some embodiments, the step of forming the second patterned photoresist PR2 as shown in FIG. 10A is the same as or similar to that as shown in FIG. 5G, so it can be referred to the description about FIG. 5G and will not be repeated here.

Figure 10B:
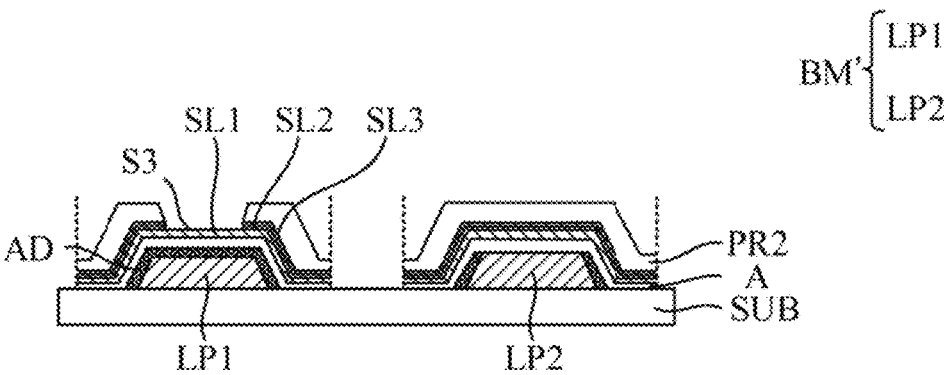

Reference is made to FIG. 10B. FIG. 10B is a schematic cross-sectional view of an intermediate stage of a method of manufacturing a structure having multi metal layers according to some embodiments of the present disclosure. The intermediate stage shown in FIG. 10A may be sequentially followed by the intermediate stage shown in FIG. 10B. As shown in FIG. 10B, the third sub-layer SL3 and the second sub-layer SL2 in the first hollow portion H1 are selectively etched relative to the first sub-layer SL1 to expose a surface portion S3 of the first sub-layer SL1 in the first hollow portion H1.

In some embodiments, the second sub-layer SL2 which contains molybdenum may be etched by using hydrogen peroxide and citric acid solution.

In some embodiments, an etch selectivity of the second sub-layer SL2 and the first sub-layer SL1 in the selectively etching is higher than 2.0.

In some embodiments, the second sub-layer SL2 may be omitted. That is, the top metal layer TM may only include the first sub-layer SL1 which contains aluminum and the third sub-layer SL3 which contains copper.

Figure 10C:
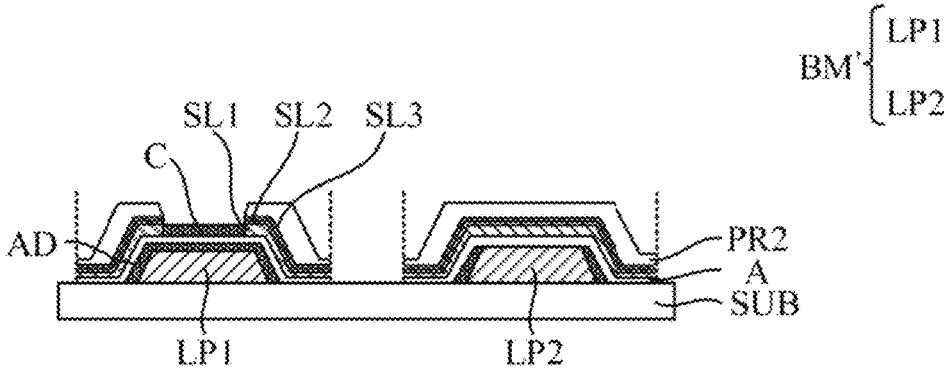

Reference is made to FIG. 10C. FIG. 10C is a schematic cross-sectional view of an intermediate stage of a method of manufacturing a structure having multi metal layers according to some embodiments of the present disclosure. The intermediate stage shown in FIG. 10B may be sequentially followed by the intermediate stage shown in FIG. 10C. As shown in FIG. 10C with reference to FIG. 10B, the surface portion S3 of the first sub-layer SL1 exposed by the first hollow portion H1 is anodized through the second patterned photoresist PR2 until the top metal layer TM has an anodized segment C extended from the surface portion of the first sub-layer SL1 exposed by the first hollow portion H1 to a side of the first sub-layer SL1 facing the semiconductor layer A. In some embodiments, the step of anodizing the first sub-layer SL1 of the top metal layer TM as shown in FIG. 10C is the same as or similar to that as shown in FIG. 5H, so it can be referred to the description about FIG. 5H and will not be repeated here.

In some embodiments, the top metal layer TM as shown in FIG. 8A may be replaced by the top metal layer TM as shown in FIG. 10A, and after the top metal layer TM is exposed by the second hollow portion H2 of the second patterned photoresist PR2 as shown in FIG. 8C, the third sub-layer SL3 and the second sub-layer SL2 in the second hollow portion H2 can be selectively etched relative to the first sub-layer SL1 to expose the first sub-layer SL1. Afterwards, the step of anodizing the top metal layer TM (as the intermediate stage shown in FIG. 8D) and the step of removing the second patterned photoresist PR2 can be sequentially performed.

According to the foregoing recitations of the embodiments of the disclosure, it can be seen that the method disclosed in the present disclosure can be used to manufacturing a structure having multi metal layers. In addition, the method of the present disclosure can also be used to manufacture a thin-film transistor by only using two sets of PEP. Therefore, the manufacturing cost can be significantly reduced and the manufacturing efficiency can be effectively enhanced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a structure having multi metal layers, comprising:

depositing a top metal layer on a bottom metal layer;

forming a patterned photoresist on the top metal layer;

etching the top and bottom metal layers through first hollow portions of the patterned photoresist to respectively form a top metal pattern and a bottom metal pattern;

forming a second hollow portion in the patterned photoresist to expose a portion of the top metal pattern;

etching the top metal pattern through the second hollow portion until a top surface portion of the bottom metal pattern is exposed by the etched top metal pattern, wherein an etch selectivity of the top and bottom metal layers in the etching the top metal pattern is greater than 1.0; and anodizing the top surface portion to form an anodized segment of the bottom metal layer.

2. The method of claim 1, wherein an atomic ratio of aluminum in the bottom metal layer is greater than 50%.

3. The method of claim 1, wherein the bottom metal layer comprises at least one element of aluminum, zirconium, hafnium, and tantalum.

4. The method of claim 1, wherein the bottom metal layer comprises at least one rare earth element.

5. The method of claim 1, wherein the bottom metal layer comprises aluminum and silicon.

6. The method of claim 1, wherein an atomic ratio of copper in the top metal layer is greater than 80%.

7. The method of claim 1, wherein an etch selectivity of the top metal layer and the anodized segment and an etch selectivity of the bottom metal layer and the anodized segment in the etching the top and bottom metal layers are greater than 1.0.

8. The method of claim 1, wherein the patterned photoresist has a first mask portion and a second mask portion thicker than the first mask portion before the etching the top and bottom metal layers, wherein the forming the second hollow portion is performed by removing the first mask portion while remaining the second mask portion, and wherein the anodizing is performed through the remained second mask portion.

9. The method of claim 1, wherein the anodizing is performed until the anodized segment reaches a side of the bottom metal layer away from the top metal layer.

10. The method of claim 1, wherein the anodized segment is spaced apart from a side of the bottom metal layer away from the top metal layer.

11. The method of claim 10, wherein the bottom metal layer has an unanodized part between the anodized segment and the side of the bottom metal layer, and a thickness of the unanodized part is equal to or greater than $1/10$ of a thickness of the bottom metal layer before the anodizing.

12. The method of claim 1, wherein the etch selectivity of the top and bottom metal layers in the etching is greater than 2.0.

13. The method of claim 1, further comprising:

depositing a semiconductor layer; and depositing the bottom metal layer on the semiconductor layer before the depositing the top metal layer.

14. The method of claim 13, wherein the anodizing is performed until the bottom metal pattern further has two metal segments connected to the anodized segment and electrically isolated from each other by the anodized segment.

* * * * *